United States Patent [19]

Fazi et al.

[11] 4,310,761
[45] Jan. 12, 1982

[54] INFRARED DETECTOR DEVICE FOR THE EXPLORATION OF THERMAL IMAGES BY SYSTEMS OPERATING A SCANNING OF THE PARALLEL SERIES TYPE WITH THE RELATIVE MANUFACTURING PROCESS

[76] Inventors: Marco Fazi, Via Mario fascetti 26, 00136 Roma; Heinz K. Diedrich, Via Lipari, 1, 00141 Roma, both of Italy

[21] Appl. No.: 49,509

[22] Filed: Jun. 18, 1979

[30] Foreign Application Priority Data

Sep. 15, 1976 [IT] Italy ............... 51273 A/76

[51] Int. Cl.³ .............................................. G01J 1/00
[52] U.S. Cl. .................................. 250/342; 250/349
[58] Field of Search ............. 250/330, 334, 338, 342, 250/349

[56] References Cited

U.S. PATENT DOCUMENTS 3,098,930  7/1963  Clark .................................. 250/349
4,054,797  10/1977  Milton et al. ...................... 250/334

*Primary Examiner*—Alfred E. Smith
*Assistant Examiner*—Janice A. Howell
*Attorney, Agent, or Firm*—Holman & Stern

[57] ABSTRACT

Disclosed is a parallel/series infrared scanner for detecting thermal images. "N" infrared detecting elements are arranged in series to scan a single portion of an I.R. image. Adjacent portions of the I.R. image are scanned by additional elements also arranged in series but parallel to the "N" series of elements. The specific detector elements can be selectively activated in order to compensate for disuniformity among detectors in the series. Thus, it is unnecessary to utilize precisely identical infrared detector elements because the number of activated elements in a single series can be adjusted to provide a uniform output which is precisely matched to the output of the other series of detectors.

4 Claims, 8 Drawing Figures

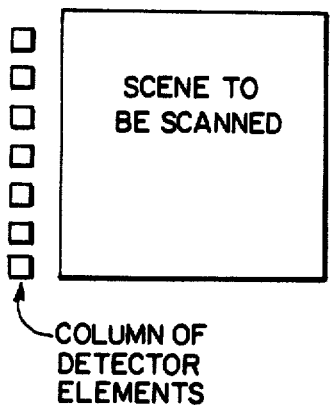
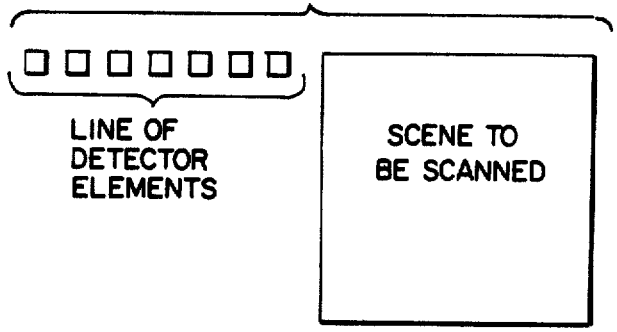
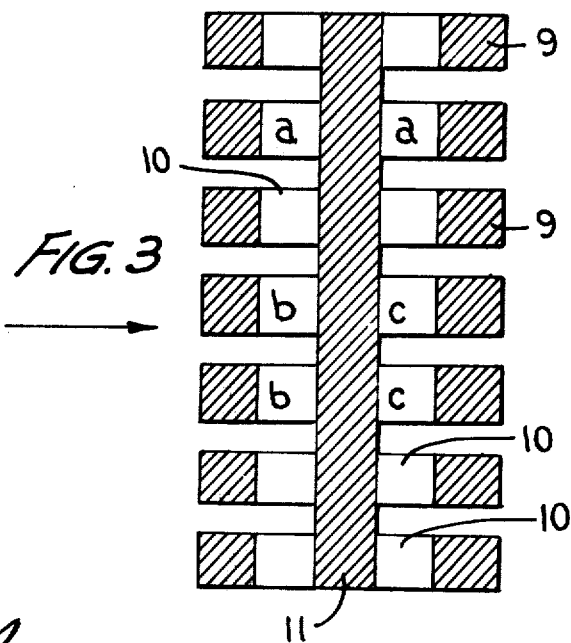
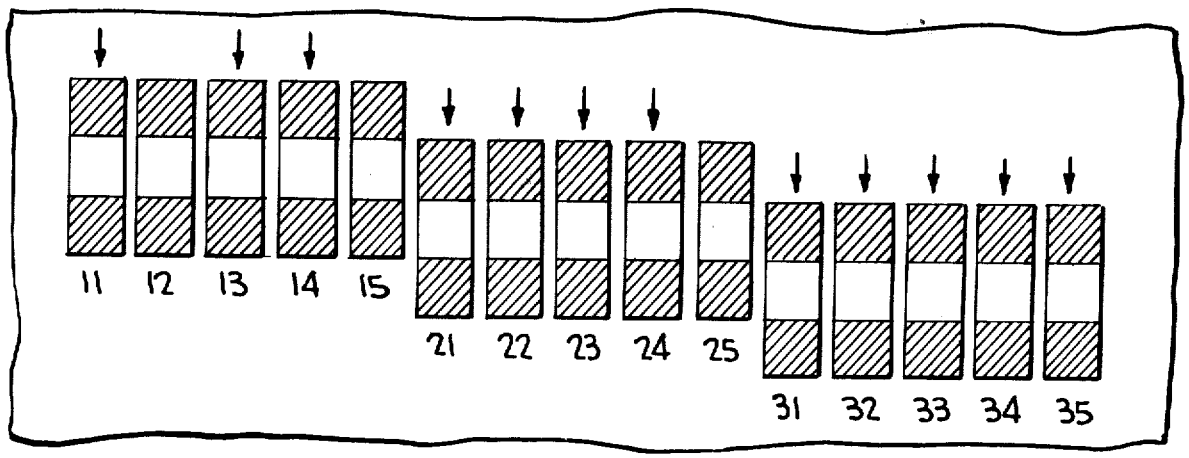

INFRARED DETECTOR DEVICE FOR THE EXPLORATION OF THERMAL IMAGES BY SYSTEMS OPERATING A SCANNING OF THE PARALLEL SERIES TYPE WITH THE RELATIVE MANUFACTURING PROCESS

This is a continuation of application Ser. No. 825,140, filed Aug. 16, 1977.

This invention relates to infrared detector devices which examines thermal images and, more particularly, to such devices of the parallel-series scanning type.

In particular, this invention relates to an infrared detector device for the examination of thermal images, the photosensitive elements of which are distributed in a configuration which optimizes sensitivity and renders sensitivity of the lines uniform in view of the particular performance requirements of the system and the technological characteristics of the initial material.

The difficulties that, at present, have to be faced during the creation of the above-mentioned devices are well-known. Those difficulties arise mainly from the characteristics of the semiconductor material from which the photosensitive elements are fabricated and from the related technologies involved in their fabrication.

As far as this second point is concerned, it is necessary to take into consideration that the semiconductor materials used are not conventional.

Therefore, standardized techniques employing flow charts which are to be strictly applied during fabrication do not exist.

All the technological processes have a yield which, after a time, must be optimized depending on the particular geometrical and electrical characteristics of the initial material.

As for the semiconductor material, which is presently commercially available, it is necessary to limit the amount of un-utilized material, because of its high cost.

However, in addition to crystalline flaws or defects due to the breaking of the slice during the fabrication phase, the semiconductor material that is supplied as slices of varying thickness shows some disuniformity of stoichiometric composition and therefore of electric characteristics.

Consequently, due to the incomplete knowledge of the characteristics of the initial material and to the complexity of the technologies that must be used, it is quite difficult to foresee the electro-optic characteristics of every single element of a multi-element infrared detector of any specific geometry.

In order to at least partially overcome these shortcomings and to limit the variation in the electro-optic characteristics of the photosensitive elements, we provide I.R. detectors with many photosensitive elements forming each detector, after the photosensitive elements have been selected. In this way it is possible to limit the contribution to the variation of the element characteristics to those within the technological processes of glueing and welding only.

However, this solution implies consideration fabrication difficulties that result in imprecise sensing geometry and in a considerable complexity of the assembling technology, these being only partially overcome by fabricating multi-element detectors as a limited number of series of elements each comprising more detectors. These difficulties of fabrication and the resulting low yield contribute to keep the cost of such a device high.

In addition to this, it is necessary to consider that multi-element infrared detectors are fabricated with geometries fit to the system in which they are employed and in particular to the type of scanning they are required to perform.

FIG. 1 illustrates parallel scanning in which the scene is shot so that each photosensitive element examines one area (or line) of it. The advantage of the system resides in the relative facility with which scanning can be accomplished (the scanning must be made along one direction only).

A further advantage is that the operating frequency band of the device need not be necessarily wide.

The disadvantage of the parallel scan arrangement resides in the fact that the detected information differences between the lines forming the image in the video-device do not depend only on the configuration of the scene but also on the different detection power or sensitivity of the photosensitive elements that scanned the scene. In the case of a detector with a blind or inoperable element, the relative line on the video-device will be without any information.

In this case, one usually attempts to decrease as much as possible the variations of the electro-optic characteristics of the elements caused by the various technological processes which the detector has undergone during fabrication, however being constrained to the disuniformity of the basic semiconductor.

This defect is eliminated with the series scanning of the type shown in FIG. 2 in which all the lines forming the scene are scanned by all of the photosensitive elements of the detector. With this scanning system, the information differences between different lines (i.e. resolution) is due only to the scene. Actually, it should be taken into consideration that information must however by "sampled" in such a way as to obtain on the scanning system a number "n" of colors or hues which correspond to respective I.R. radiation powers or sensitivities. The information accuracy supplied by the detector is, therefore, superabundant taking into account the limited number of hues "n" of the image sampling, which number is ultimately determined by the statistical spread of the photonic population (i.e. light energy spectrum) of a priming radiation.

Also, this scanning technique, even if it reaches a high accuracy level of information detection, has the disadvantage of requiring scanning machinary moving in both directions and requiring extremely rapid I.R. detectors because of the necessarily wide frequency band.

Therefore, the purpose of this invention is to provide an infrared detector device for the examination of thermal images which permits a high level of detection power in every line and to a high degree of uniformity of detection sensitvity from line to line.

Another object of the present invention is to provide a new I.R. detector device for the examination of thermal images in which the configuration of the photosensitive elements takes into consideration the variations in the response characteristics of the elements themselves.

Moreover, another object of this invention is to provide a device, the configuration of which is determined with due consideration to the variety of operating characteristics required by the system.

In order to accomplish the above-mentioned objects and to overcome those disadvantages connected with the prior art techniques, the device according to this invention has been provided.

Through an arrangement of the elements according to both longitudinal and transverse configuration, this device lends itself to a scanning of the parallel-series type while moving or shifting in one direction only.

In the following paragraphs, the invention is described more in detail, in particular with reference to the drawings.

FIG. 1 is a schematic example of a scanning made in a parallel way in the prior art;

FIG. 2 is a schematic example of a scanning made in series in the prior art;

FIG. 3 is an illustrative example of the working principle of the device of the present invention;

FIG. 4 is a schematic example of the configuration of the photosensitive elements of the device of the present invention;

In order to understand more easily the operative working of the device according to this invention an example can be useful: instead of an array of photosensitive elements performing a scanning of a scene in a parallel manner, one can use a device of the type shown in FIG. 3 in which the cross-hatched areas 9 designate ohmic contacts, the white areas 10 designate the photosensitive elements and the arrow shows the scanning direction.

Such a device formed by "2n" elements arranged in such a way that every line of the scene is scanned by a couple of detectors while "n" couples carry out the scanning of "n" line in a parallel manner.

From the technological point of view, the fabrication of the detector shown in FIG. 3 is not much more difficult that fabrication of a series of "n" photosensitive elements set in line.

As to the quantity of employed material, it will be quite the same in both cases, since only a small part of the slice of semiconductor material is normally used for the fabrication of the photosensitive elements, while a large part of the area is occupied by the ohmic contacts and by the interconnection 11 between the photosensitive elements 10 and the electronic circuits that are external to the detector.

In FIG. 3, by considering the "a" marked elements it is possible to assume that these have a detection power or sensitivity equal to $D_\lambda^* = (\lambda/\sqrt{2})D_\lambda^*$ (BLIP) where $D_\lambda^*$ (BLIP) represents the maximum detection power that is supposed to be obtained by a single detector and it is limited by the background photon noise (BLIP=-Background Limited Photon Noise).

Considering that these "a" elements perform a series scan, the detection capacity of the line of the scanned scene will be $D_\lambda^*$ TOT $= \sqrt{2} D_\lambda^* = D_\lambda^*$ (BLIP). Now, if the "b" marked elements are considered for purposes of example, to be blind (i.e. damaged or non-operating); however, the lines of the scene scanned by the "b" elements is not blind (i.e. there is an image to be detected); then, by employing a gemometry such as that shown in FIG. 3, because of the "c" elements in the same line with the "b" elements, it will be possible to make the detection power on every line more uniform and it will be possible to reduce if not to eliminate the blind lines.

Now, it has to be considered that for proper operation of the system, it is necessary that all the lines subdividing the scene are scanned by means of detectors that show values of detection power as uniform as possible, this being the reason for resorting to the series type scanning in some prior art cases.

Figure 5:
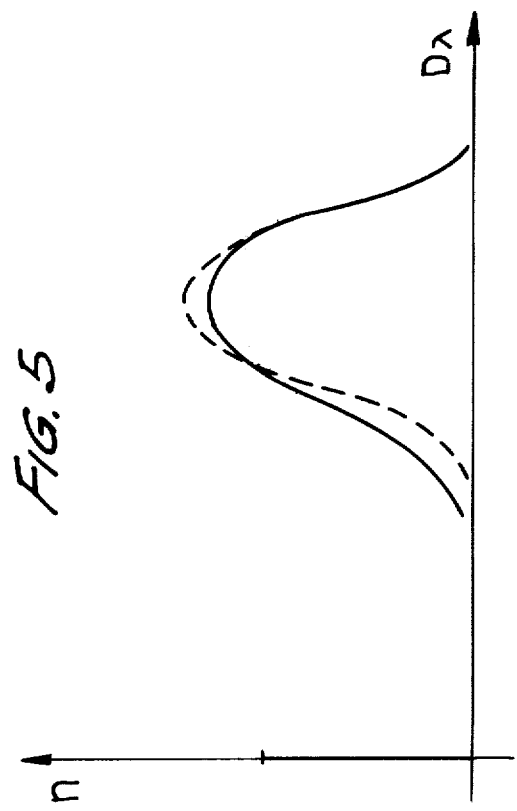

Now, let us assume that it is necessary to design a device for shooting a thermal image that makes the use of a detector made up of "N" elements. In all the technologies concerning providing a slice of semiconductor material, a distribution of the detection power of the photosensitive elements is obtained, for example, such as that shown in FIG. 5; that is, a certain number of blind or damaged elements, designated by a solid marked line, and a distribution of detection power that is slightly different from the Gaussian distribution (dashed in FIG. 5).

From the trend of such a curve, it is possible to obtain an optimum number of elements to scan one line, through an optimization calculation in which it is better not to go into details since it is the normal concern of the ordinarily skilled technicians in that particular field.

For purposes of an example, let us assume that from such a calculation there results an optimum number equal to five, as shown in FIG. 4.

Therefore, a configuration or array will be predetermined; it is made up by a body of different series of five horizontally aligned elements each of these series being stepped downward as compared with the previous series, and the step distance being equal to the space between two successive scanning lines in the scene or image being scanned.

Then all the elements are tested and the relative detection power measuring is begun.

To make an example in Table A, there is set forth a number of values obtained by the measuring the detection power of the elements forming the three lines of the example shown in FIG. 4, each line made up of five elements.

TABLE A

| | | | | | | |
|---|---|---|---|---|---|---|
| → | $D_{\lambda11}^*$ | $= 2.8 \cdot 10^{10} \rightarrow$ | $D_{\lambda21}^*$ | $= 1.8 \cdot 10^{10} \rightarrow$ | $D_{\lambda31}^*$ | $= 1.8 \cdot 10^{10}$ |
| | $D_{\lambda12}^*$ | $= \rightarrow$ | $D_{\lambda22}^*$ | $= 2.0 \cdot 10^{10} \rightarrow$ | $D_{\lambda32}^*$ | $= 1.7 \cdot 10^{10}$ |
| → | $D_{\lambda13}^*$ | $= 2.0 \cdot 10^{10} \rightarrow$ | $D_{\lambda23}^*$ | $= 2.6 \cdot 10^{10} \rightarrow$ | $D_{\lambda33}^*$ | $= 2.0 \cdot 10^{10}$ |
| → | $D_{\lambda14}^*$ | $= 2.2 \cdot 10^{10} \rightarrow$ | $D_{\lambda24}^*$ | $= 2.05 \cdot 10^{10} \rightarrow$ | $D_{\lambda34}^*$ | $= 2.0 \cdot 10^{10}$ |
| | $D_{\lambda15}^*$ | $= 2.6 \cdot 10^{10}$ | $D_{\lambda25}^*$ | $= 0.6 \cdot 10^{10} \rightarrow$ | $D_{\lambda35}^*$ | $= 1.78 \cdot 10^{10}$ |
| | $<D_\lambda^*>_1$ | $= 2.6 \cdot 10^{10}$ | $<D^*>_2$ | $= 2,07 \cdot 10^{10}$ | $<D_\lambda^*>_3$ | $= 1.85 \cdot 10^{10}$ |

TABLE A-continued

| $D^*_{\lambda 1}$ = 4.15 · 10$^{10}$ | $D^*_{\lambda 26}$ = 4.15 · 10$^{10}$ | $D^*_{\lambda 3}$ = 4.16 · 10$^{10}$ |
|---|---|---|

Calculating for each line the value:

$$<D^*_\lambda>_i = \sum_{k=1}^{n} \sqrt{\frac{D^*_{\lambda i}}{n}},$$

the values are reported in the same Table A are obtained for the three lines.

Now it is possible to see that by selecting appropriately the photosensitive elements to be used for each operation within each series (these elements are pointed out by the arrows in FIG. 4 and in Table A), it is possible to obtain for each series, a cumulative values $D_{\lambda i}* = \sqrt{m} <D_\lambda*>_i$ that is very close for each series. In other words, the total detecting power of each series can be made approximately equal by proper selection of elements having known, but different, detecting powers.

In the illustrated example 3 elements of the first line 4 elements of the second line and 5 elements of the third one have been selected for activation.

This last line, having the minimum value of line detection power ($<D_\lambda*>_3 = 1.86 \cdot 10^{10}$), determines the maximum value of detection power that can be used for each line of the image on the screen.

Figure 6:
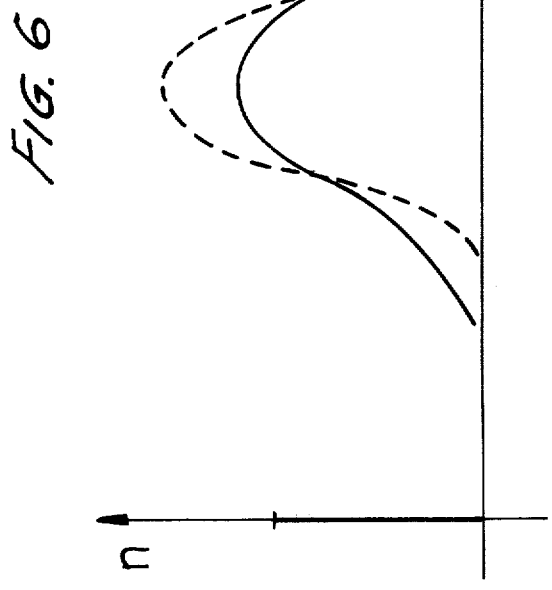
FIGS. 5 and 6 show two graphics which illustrate two distributions of the detection power depending upon the number of elements employed.

Thus, it is possible to obtain a high degree of uniformity in the values of the detection power. If we assume the worst possible individual photosensitive element detection power distribution (i.e. the greatest possible element-to-element variation) for example, such as that represented in FIG. 6, then in order to obtain uniform performance of the device, it will be necessary that some lines be made up of series of more elements than others.

Figure 7:
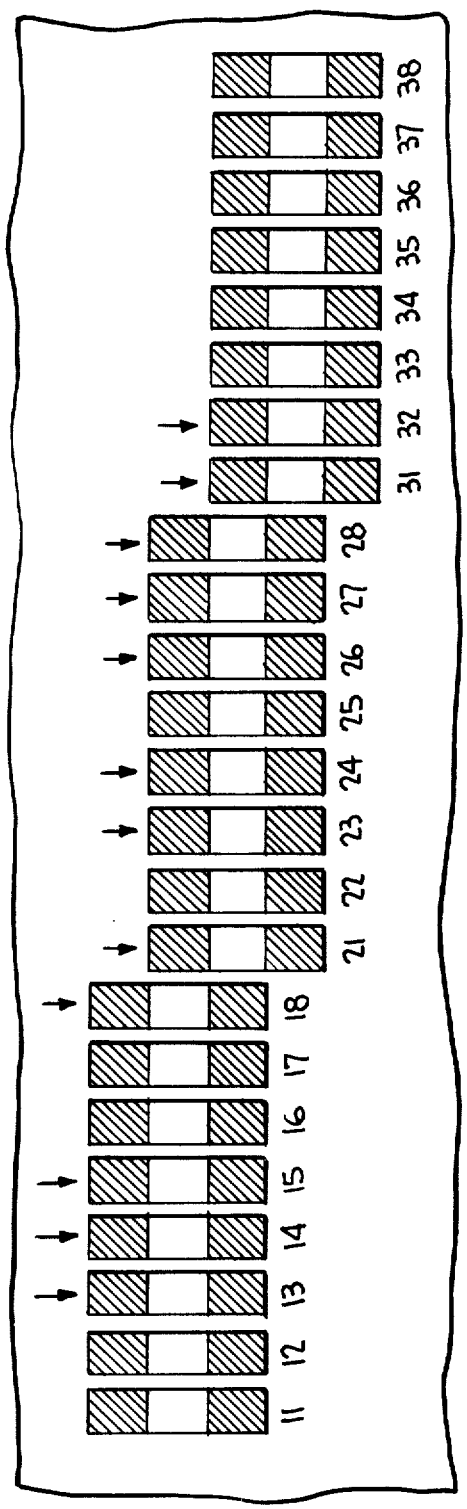
FIG. 7 is a further example of the configuration of the photosensitive elements of the device in uniformity with this invention.

The Table B, listed below, is similar to Table "A" but is concerned with the case in which the elements of every series are, for example, eight in number. The element array is shown in FIG. 7.

the invention in which the photosensitive elements are arranged in series of 8 elements. These series are vertically shifted so as to comprehand the entire area of the figure to be examined, using only one shift or scan along the direction pointed out by the arrow X.

For reasons of convenience, the series of elements have been paired two by two in order to link together common terminals of the 16 elements forming a couple or pair of series.

The photosensitive elements are designated by reference numeral 12, the ohmic contact common to two series is designated by 13 and the device support is 14.

The specific object of this invention as described is to provide an infrared detector device for the examination of thermal images utilizing a scanning operation of the parallel-series type characterized by the fact that the photosensitive elements are arranged on the support according to a plurality of series, each being made up by "n" elements.

The elements of every series are transversely aligned in a direction parallel to the scanning movement, while the various series are longitudinally arranged in a direction that is perpendicular to the scanning movement, so that the distance between a series and that immediately below it is equal to the distance between two successive lines of scanning. The number of series is such to comprehend the entire image to be scanned with only a single transverse scanning movement. In every line a number of element less then or equal to "n" have to be chosen previously for activation and that number is such as to make the values of the average detection power of every line as uniform as possible.

As above-described, the number "n" of elements forming each line is calculated taking into consideration the distribution of the values of the detection power of the photosensitive elements obtained through a particular technological process and with a certain initial semiconductor material.

In the carrying out of detection power calculations,

TABLE B

| $D^*_{\lambda 11}$ | = | ‖ | → | $D^*_{\lambda 21}$ | = | 2.0 · 10$^{10}$ → | $D^*_{\lambda 31}$ | = | 2.85 · 10$^{10}$ |
|---|---|---|---|---|---|---|---|---|---|
| $D^*_{\lambda 12}$ | = | | | $D^*_{\lambda 22}$ | = | → | $D^*_{\lambda 32}$ | = | 3.0 · 10$^{10}$ |
| → $D^*_{\lambda 13}$ | = | 1.8 · 10$^{10}$ → | | $D^*_{\lambda 23}$ | = | 1.7 · 10$^{10}$ | $D^*_{\lambda 33}$ | = | |
| → $D^*_{\lambda 14}$ | = | 1.9 · 10$^{10}$ → | | $D^*_{\lambda 24}$ | = | 1.8 · 10$^{10}$ | $D^*_{\lambda 34}$ | = | 2.0 · 10$^{10}$ |
| → $D^*_{\lambda 15}$ | = | 2.0 · 10$^{10}$ | | $D^*_{\lambda 25}$ | = | | $D^*_{\lambda 35}$ | = | 2.2 · 10$^{10}$ |
| $D^*_{\lambda 16}$ | = | 2.2 · 10$^{10}$ → | | $D^*_{\lambda 26}$ | = | 1.7 · 10$^{10}$ | $D^*_{\lambda 36}$ | = | 3.7 · 10$^{10}$ |
| $D^*_{\lambda 17}$ | = | 0.8 · 10$^{10}$ → | | $D^*_{\lambda 27}$ | = | 1.4 · 10$^{10}$ | $D^*_{\lambda 37}$ | = | 2.6 · 10$^{10}$ |
| → $D^*_{\lambda 18}$ | = | 2.5 · 10$^{10}$ → | | $D^*_{\lambda 28}$ | = | 1.5 · 10$^{10}$ | $D^*_{\lambda 38}$ | = | 0.8 · 10$^{10}$ |
| $<D^*_\lambda>_1$ | = | 2.8 · 10$^{10}$ | | $<D^*_\lambda>_2$ | = | 1.69 · 10$^{10}$ | $<D^*_\lambda>_3$ | = | 2.93 · 10$^{10}$ |
| $D^*_{\lambda 1}$ | = | 4.15 · 10$^{10}$ | | $D^*_{\lambda 29}$ | = | 4.15 · 10$^{10}$ | $D^*_{\lambda 3}$ | = | 4.15 · 10$^{10}$ |

It is necessary to take into consideration that the selective criterion of the elements to be put in action was determined by the fact that the total number of the elements to be put in operation is still equal to 12 as in the previous example relating to Table A.

Figure 8:
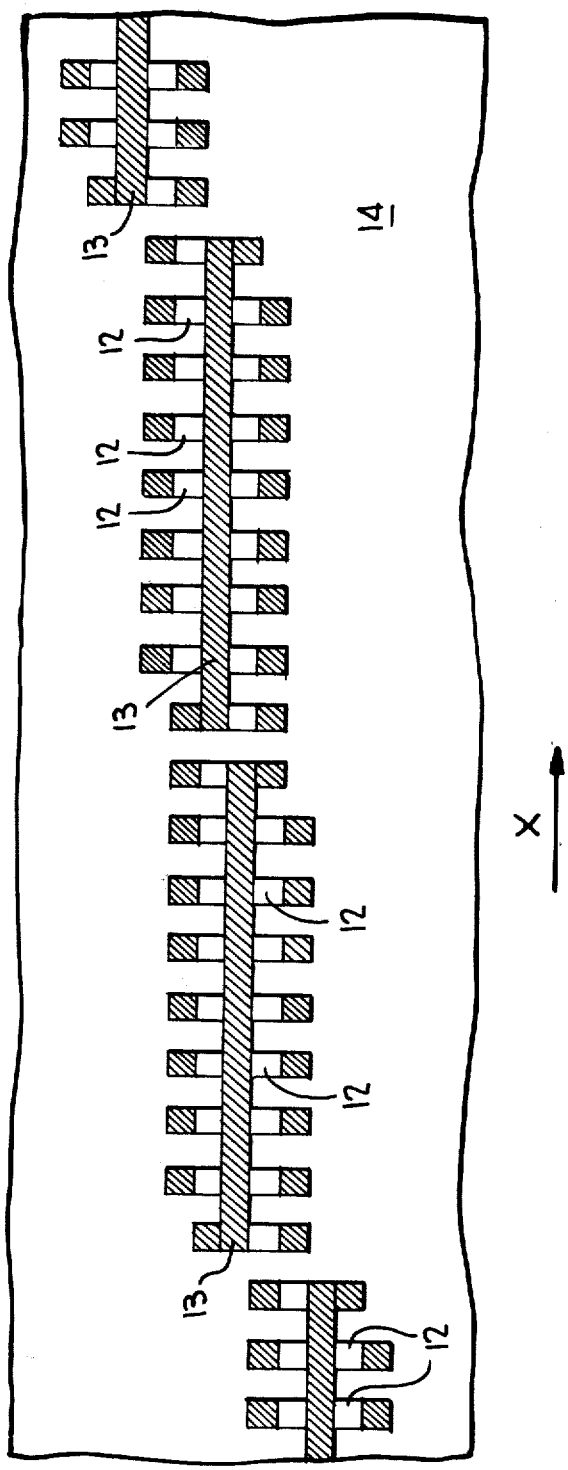
FIG. 8 schematically shows the arrangement of the photosensitive elements in a particular embodiment according to this invention.

Now with reference to FIG. 8, a further device is illustrated which represents a particular embodiment of the particular level of performance that is required from the system is, of course, considered.

In addition to the above-mentioned conditions, the choice of the number of elements that is put in operation in each line also depends on the total number "N" of photosensitive elements that the system can control.

The device that has been described above offers clear advantages as compared with the devices in operation in the prior art. In particular, an advantage as compared to a configuration merely in series is that it is not necessary to pay the excess of the information accuracy with the disadvantage of this last scanning method.

With the parallel-series scanning of the device in conformity with this invention, it is possible to eliminate the need of having detectors with a very low response-time with the disappointing consequence that sometimes this corresponds to a spoiling of the other electro-optic performances.

As compared to a parallel-scan type device, the device in accordance with this invention allows the maximization of the electro-optic performances of the I.R. system in which it is utilized. The above-mentioned increase is carried into effect, as has been described, in the overcoming the variations of the electro-optic characteristics of the elements and in the absence of blind lines, beyond the very limitations imposed by the initial semiconductor material and by the technologies of fabricating of the detector itself.

Ultimately, the listed advantages are a reduction of the fabrication cost of the I.R. vision system, provided with the increase of the performances of it.

Therefore, the device according to this invention, is fabricated through the process made by the following phases:

(a) calculation of the number of elements that will make up each of the series conforming to the statistic distribution of detection power possessed by the photosensitive elements that have been created with a certain technological process and with an initial semiconductor material that has certain characteristics and on the basis of the final performances required by the said system;

(b) execution of the technological process that creates the desired distribution according to (a);

(c) connection of single elements with the external circuit;

(d) measurement of the characteristics of detection power of the various elements and locating of the possible blind or damaged elements; and (e) sorting of the elements to be put in operation in every line according to the optimization criterion of the detection power of the lines and a maximum standardization of the detection power values of the various lines.

Eventually, it has to be said that the geometries and the applications proposed for an I.R. photoconductive device of the parallel-series type can be immediately used even for a device of the photovoltaic type only inserting the fabrication of the photodiode into the above-mentioned fabrication processes.

This invention has been described in accordance with its particular embodiment, but, of course, it can be modified and changed both in the arrangement of its parts and in the process of fabrication without exceeding the limits of the inventive field of this industrial invention for this reason.

We claim:

1. An infrared scanner wherein an infrared image is moved relative to infrared detectors in a scanning movement, said improvement comprising:

an array of a plurality of series of infrared detectors, each series made up of "N" infrared detectors where "N" is a positive integer, each series being aligned parallel to the scanning movement, adjacent series being spaced in the direction normal to the scanning movement by an amount equal to a desired distance between two scanning lines, each series having a first detector positioned ahead of the other detectors of that series in the scan direction, the first detectors being offset from one another in the scanning movement direction, the plurality of series comprehending in said normal direction the entire infrared image to permit coverage of said entire image in a single scan in the scanning movement direction.

2. The scanner according to claim 1 further comprising means for selecting individual detectors for operation in each series such that the overall sensitivity of each series is approximately the same.

3. The scanner according to claim 1 further comprising means for preselecting detectors in each series for operation during a scanning movement.

4. A method of operating a parallel series infrared scanner wherein an infrared image is moved relative to infrared detectors in a scanning movement, said scanner comprising an array of a plurality of series of infrared detectors, each series made up of "N" infrared detectors where "N" is a positive integer, each series being aligned parallel to the scanning movement, adjacent series being separated normal to the scanning movement direction by an amount equal to a desired distance between two scanned lines, the plurality of series comprehending the complete infrared image in a single scanning movement, said method comprising the steps of:

measuring the individual output level from each detector in a series under a uniform infrared input; and activating only those detectors in a series which give a combined output substantially equal to the combined activated detector output of the other series in said array, thus providing uniform detection among the series of detectors.

* * * * *